United States Patent

Yamazaki et al.

[11] Patent Number: 6,089,439
[45] Date of Patent: Jul. 18, 2000

[54] WIRE CUTTING AND FEEDING DEVICE FOR USE IN WIRE BONDING APPARATUS

[75] Inventors: Nobuto Yamazaki, Kunitachi; Minoru Torihata; Takayuki Iiyama, both of Musashi Murayama, all of Japan

[73] Assignee: Kabushiki Kaisha Shinkawa, Tokyo, Japan

[21] Appl. No.: 08/801,068

[22] Filed: Feb. 14, 1997

[30] Foreign Application Priority Data

Feb. 15, 1996 [JP] Japan .................................. 8-052367

[51] Int. Cl.⁷ ........................................... B23K 37/00
[52] U.S. Cl. ........................ 228/4.5; 228/4.1; 228/44.7; 228/44.3; 228/904; 228/180.5
[58] Field of Search ........................ 228/4.5, 4.1, 44.7, 228/44.3, 904, 180.5; 219/56.21

[56] References Cited

U.S. PATENT DOCUMENTS 4,597,522  7/1986  Kobayashi ............................. 228/179
4,603,803  8/1986  Chan et al. ............................. 228/4.5
5,297,722  3/1994  Takahashi et al. .................... 228/180.5
5,452,838  9/1995  Farassat ................................. 228/1.1

FOREIGN PATENT DOCUMENTS 56-30118  7/1981  Japan ............................ B23K 20/100
4-65537  10/1992  Japan ............................ H01L 21/607

*Primary Examiner*—Patrick Ryan
*Assistant Examiner*—M. Alexandra Elve
*Attorney, Agent, or Firm*—Koda & Androlia

[57] ABSTRACT

In a wire cutting and feeding device used in a wire bonding apparatus, piezo-electric actuators are used as the driving source of a slide block which moves wire clamper toward and away from a workpiece upon which bonding is performed. The piezo-electric actuators include a feeding piezo-electric actuator, which causes expansion and contraction of the slide block, and two clamping piezo-electric actuators, which are alternately operated and clamp the slide block. The slide block is caused to move by means of respective power-"on"/power-"off" combinations of the feeding piezo-electric actuator and the two clamping piezo-electric actuators.

4 Claims, 6 Drawing Sheets

WIRE CUTTING AND FEEDING DEVICE FOR USE IN WIRE BONDING APPARATUS

BACKGROUND OF THE INVENTION

1. Field of the Invention

The present invention relates to a wire cutting and feeding device for use in a wire bonding apparatus.

2. Prior Art

A conventional wire cutting and feeding device used in a wire bonding apparatus will be described with reference to FIGS. 12 and 13.

An ultrasonic horn 2 is fastened to a Z direction driver 1 which is driven in the Z (vertical) direction by a Z driving means (not shown), and a bonding tool 3 is fastened to the tip end of this ultrasonic horn 2. A wire damper 4 is attached to a damper attachment plate 5 so as to be located at the rear end of the bonding tool 3. A wire 6 which is supplied from a wire spool (not shown) passes through a hole formed in the ultrasonic horn 2, the wire damper 4, and a guide hole formed in the bonding tool 3, thus extending downward from the tip end of the bonding tool 3.

The clamper attachment plate 5 is fastened to an attachment block 7, and this attachment block 7 is fastened to a slide block 8. This slide block 8 is attached to a base plate 9 via a linear guide bearing 10 which is fastened to the base plate 9, so that the slide block 8 is able to slide on the base plate 9. A cam follower 11 is supported on the attachment block 7 so that the cam follower 11 is rotatable. A motor 12 is fastened to the base plate 9, and a cam plate 13 is fastened to the motor shaft of the motor 12. Furthermore, a coil spring 14 is mounted between the attachment block 7 and base plate 9 so that the cam follower 11 is pressed against the cam plate 13. The base plate 9 is fastened to an attachment base 15 which is equipped with a wire cutting and feeding angle adjustment mechanism, and this attachment base 15 is fastened to the Z direction driver 1. Accordingly, when the Z direction driver 1 moves vertically and in the X and Y directions, the entire apparatus also moves vertically and in the X and Y directions together with the Z direction driver 1.

Next, the wire cutting and wire feeding operations will be described. These operations are performed after the wire 6 has been bonded to a lead (second bonding point).

In particular, after the wire 6 has been pressed against the second bonding point and bonded by the bonding tool 3, the wire 6 is clamped by the wire damper 4, and the motor 12 rotates in the forward direction. When the motor 12 rotates in the forward direction, the cam follower 11 follows the dropping profile of the cam plate 13 against the driving force of the coil spring 14, so that the attachment block 7, slide block 8, damper attachment plate 5 and wire damper 4 are lifted upward by a prescribed amount (maximum: 100 microns) in the direction indicated by arrow A, thus causing the wire 6 to be cut from the end portion of the undersurface at the tip of the bonding tool 3. As a result, wire bonding to one pair of bonding points (i. e., a first bonding point on a pad and a second bonding point on a lead) is completed.

Next, in order to bond the wire 6 to the first bonding point of the next pair of bonding points, wire feeding is performed in which the wire 6 is paid out from the undersurface of the tip of the bonding tool 3 by the wire damper 4. In this case, the motor 12 rotates in the opposite direction from that described above so that the cam follower 11, attachment block 7, slide block 8, damper attachment plate 5 and wire damper 4 are pushed downward by a prescribed amount (maximum: 400 microns) in the direction indicated by arrow B (which is the opposite direction from the direction indicated by arrow A) as a result of the rising profile of the cam plate 13. As a result of this operation, the tail length required for bonding to the next first bonding point is caused to extend from the undersurface of the bonding tool 3.

The conventional wire cutting and feeding device as described above is disclosed in, for example, Japanese Patent Application Laid-Open (Kokoku) No. 56-30118, and a conventional wire cutting and wire feeding method described above is disclosed in, for example, Japanese Patent Application Kokoku No. 4-65537.

In the prior art described above, the motor 12 is used as the driving source; accordingly, the size and weight of the apparatus tend to be large. Furthermore, since the coil spring 14 is used in order to insure that the cam follower 11 attached to the attachment block 7 that holds the wire damper 4 will follow the cam plate 13, the apparatus has a characteristically low-frequency vibration. As a result, the mechanical rigidity of the apparatus is weak, and the apparatus tends to vibrate. Moreover, the feeding precision of the wire damper 4 is determined by the rotational angle of the motor 12, i. e., the rotational angle of the cam plate 13, so that it is difficult to obtain a greater precision.

SUMMARY OF THE INVENTION

The first object of the present invention is to provide a wire cutting and feeding device for use in a wire bonding apparatus which makes it possible to reduce the size and weight of the apparatus.

The second object of the present invention is to provide a wire cutting and feeding device for use in a wire bonding apparatus in which the mechanical rigidity of the apparatus is high, so that almost no vibration occurs.

The third object of the present invention is to provide a wire cutting and feeding device for use in a wire bonding apparatus in which the precision of wire cutting and wire feeding is improved, and in which combinations of rough movements and fine movements can easily be performed.

The fourth object of the present invention is to provide a wire cutting and feeding device for use in a wire bonding apparatus in which the speed of wire cutting and wire feeding can be altered in a simple manner.

The objects of the present invention are accomplished by a unique structure for a wire cutting and feeding device for use in a wire bonding apparatus in which:

a wire is clamped by a wire damper after the wire has been bonded to a second bonding point, a moving member which moves the wire damper is pulled upward in the wire cutting direction so as to cut the wire, and wire feeding is then accomplished by pushing the moving member downward in the wire feeding direction so that the tail length portion required for the next bonding operation to the next first bonding point is caused to extend from the lower end of the bonding tool, wherein piezo-electric actuators are used as a driving source of the moving member.

The objects of the present invention are accomplished by a further unique structure wherein the piezo-electrics include:

a feeding piezo-electric actuator which is used to cause expansion and contraction of the moving member, and two clamping piezo-electric actuators which are used alternately and to clamp the moving member, so that the moving member is caused to move by means of respective power "on" and power "off" combinations of the feeding piezo-electric actuator and the clamping piezo-electric actuators.

The objects of the present invention are accomplished by still another unique structure for a wire cutting and feeding device for use in a wire bonding apparatus in which:

a wire is clamped by a wire damper after the wire has been bonded to a second bonding point, a moving member which moves the wire damper is pulled upward in the wire cutting direction so as to cut the wire, and wire feeding is then accomplished by pushing the moving member downward in the wire feeding direction so that the tail length portion required for the next bonding operation to the next first bonding point is caused to extend from the lower end of the bonding tool, the device further including:

a slide block which has two clamped portions comprising first and second clamped portions and moves the wire clamper, and a first clamping body and a second clamping body which are fastened to a base plate, the first clamping body, which is expandable and contractible, being comprised of:
   a fastening section fastened to the base plate,
   arm sections which have clamping parts that clamp the first clamped portion, and
   elastically deformable thin wall sections which connect the fastening sections and the arm sections, the second clamping body being comprised of:
   a fastening section fastened to the base plate, and
   arm sections which have clamping parts that clamp the second clamped portion, and the device still further including:
   a feeding piezo-electric actuator which is attached to the first clamping body and moves the arm sections of the first clamping body by causing elastic deformation of the thin-wall sections of the first clamping body,
   a first clamping piezo-electric actuator which is attached to the arm sections of the first clamping body and opens and closes the clamping parts of the arm sections, and
   a second clamping piezo-electric actuator which is attached to the arm sections of the second clamping body and opens and closes the clamping parts of the arm sections.

The objects of the present invention are accomplished by a still another unique structure for a wire cutting and feeding device for use in a wire bonding apparatus in which:

a wire is clamped by a wire damper after the wire has been bonded to a second bonding point, a moving member which moves the wire damper is pulled upward in the wire cutting direction so as to cut the wire, and wire feeding is then accomplished by pushing the moving member downward in the wire feeding direction so that the tail length portion required for the next bonding operation to the next first bonding point is caused to extend from the lower end of the bonding tool, wherein the device further includes:

a moving plate which has first and second clamped portions and moves the wire clamper, guide blocks which are fastened to a base plate and have first and second clamping parts that clamp the first and second clamped portions of the moving plate, a feeding piezo-electric actuator which is fastened to the central portion of the moving plate, and two clamping piezo-electric actuators comprising first and second clamping piezo-electric actuators which are fastened to both end portions of the moving plate with respect to the direction of movement, and wherein the moving plate is caused to move in the wire cutting and wire feeding directions by the expansion and contraction of the feeding piezo-electric actuator, and the first and second clamping parts of the guide blocks are caused to clamp the first and second clamped portions, respectively, of the moving plate by the expansion and contraction of the first and second clamping piezo-electric actuators.

DETAILED DESCRIPTION OF THE INVENTION

First Embodiment

Figure 1:
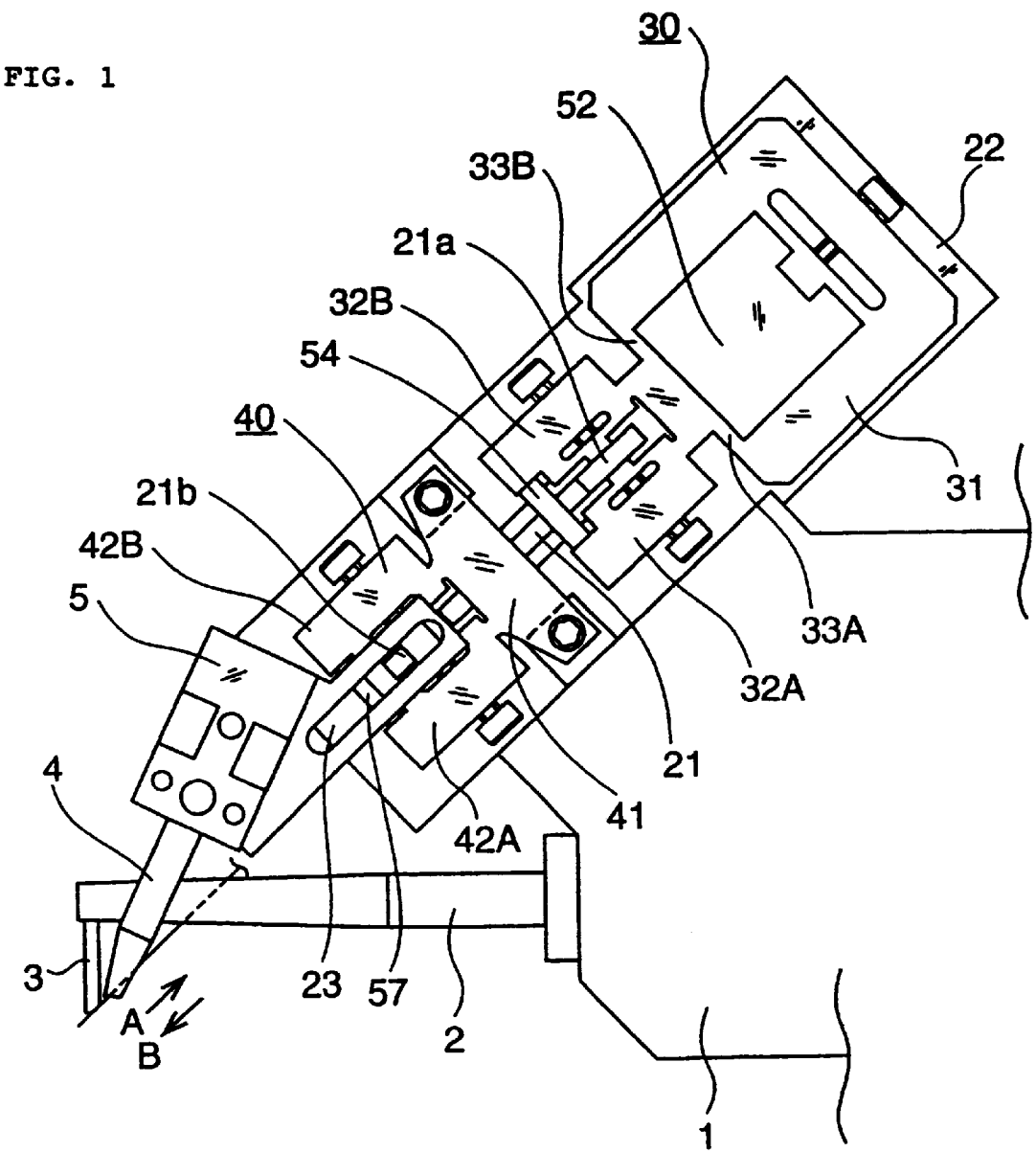
FIG. 1 is a front view which illustrates a first embodiment of the wire cutting and feeding device for use in a wire bonding apparatus provided by the present invention.
Figure 2:
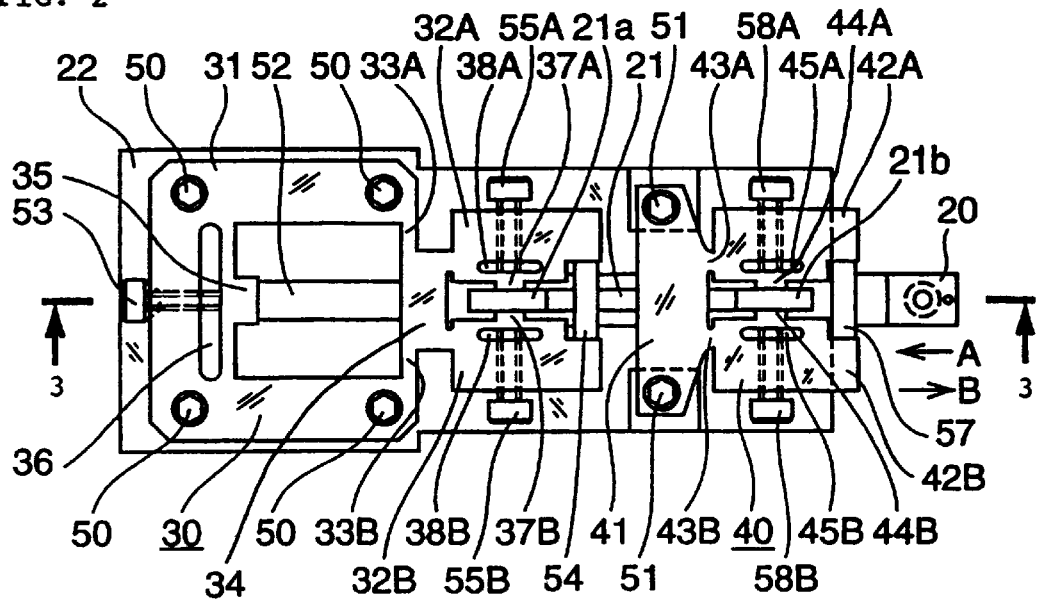
FIG. 2 is a front view of the essential portion in FIG. 1.
Figure 3:
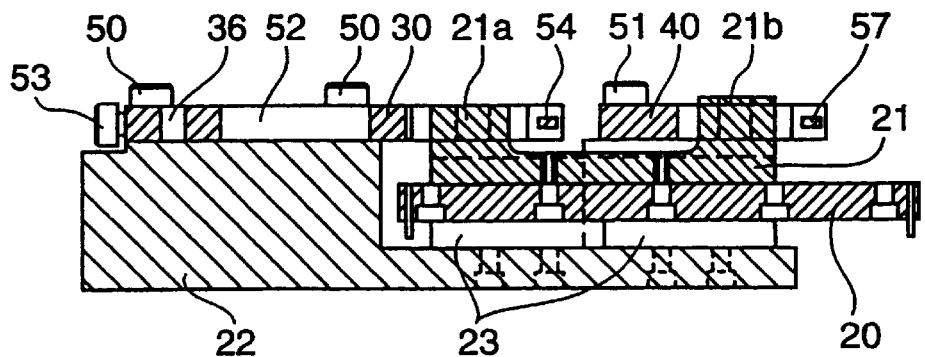
FIG. 3 is a sectional view along line 3—3 in FIG. 2.
Figure 4:
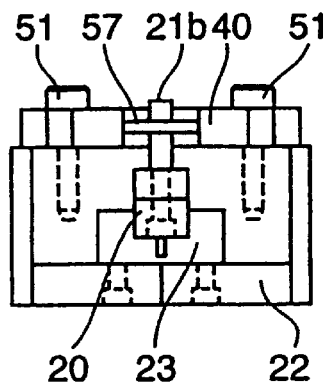
FIG. 4 is a right-side view of FIG. 2.

The first embodiment of the present invention will be described with reference to FIGS. 1 through 6. The details of the structure will be described mainly on the basis of FIGS. 2 through 4.

The damper attachment plate 5 to which a wire damper 4 is attached is fastened to a guide rail 20, and this guide rail 20 is fastened to a slide block (moving member) 21. The guide rail 20 is slidably mounted on guide bearings 23 which are fastened to a base plate 22, and this base plate 22 is fastened to a Z direction driver 1. The above structure is substantially the same as that of a conventional device.

Two portions 21a and 21b (which are clamped by clamping parts as described below and therefore referred to as "clamped portions 21a and 21b") are disposed on the slide block 21 in the sliding direction of the slide block 21. A first clamping body 30, which is expandable and contractible, and a second clamping body 40 are fastened to the base plate 22 by respective bolts 50 and 51.

The first clamping body 30, which is expandable and contractible, has a fastening section 31, which is fastened to the base plate 22, and a pair of arm sections 32A and 32B. Elastically deformable thin-wall sections 33A and 33B are formed in the areas that connect the fastening section 31 and the arm sections 32A and 32B. Furthermore, the thin-wall sections 33A and 33B are connected to form an operating section 34. A slit 36 is formed in the opposite end of the fastening section 31 from the operating section 34, so that an elastically deformable diaphragm part 35 is formed. Furthermore, both ends of a feeding piezo-electric actuator 52 are fastened in place between the operating section 34 and the diaphragm part 35. In other words, this feeding piezo-electric actuator 52 is installed so that the strain direction thereof coincides with the sliding direction of the slide block 21. Furthermore, a preliminary-pressure adjustment screw 53 which presses against the diaphragm part 35 is screwed into the fastening section 31.

The pair of arm sections 32A and 32B extend from the fastening section 31 to a position beyond (or further right in FIG. 2) the clamped portion 21a of the slide block 21; and both ends of a first clamping piezo-electric actuator 54 are fastened to the end portions of the arm sections 32A and 32B. In other words, this clamping piezo-electric actuator 54 is installed so that the strain direction thereof is perpendicular to the sliding direction of the slide block 21. The arm sections 32A and 32B have first clamping parts 37A and 37B in positions corresponding to the clamped portion 21a of the slide block 21, and slits 38A and 38B are formed so that the first clamping parts 37A and 37B can move parallel to each other. Furthermore, it is designed so that the first clamping parts 37A and 37B lock (or clamp) the clamped portion 21a in place by means of adjustment screws 55A and 55B when the clamping piezo-electric actuator 54 is in a power-"off" state.

The second clamping body 40 is comprised of a pair of arm sections 42A and 42B and a fastening section 41 which is fastened to the base plate 22 by bolts 51; in addition, elastically deformable thin-wall sections 43A and 43B are formed in the areas that connect the fastening section 41 and the arm sections 42A and 42B. These arm sections 42A and 42B extend from the fastening section 41 to a position beyond (or further right in FIG. 2) the clamped portion 21b of the slide block 21, and both ends of a second clamping piezo-electric actuator 57 are fastened to the end portions of the arm sections 42A and 42B. In other words, the second clamping piezo-electric actuator 57 is installed so that the strain direction thereof is perpendicular to the sliding direction of the slide block 21. The arm sections 42A and 42B have second clamping parts 44A and 44B at positions corresponding to the clamped portion 21b of the slide block 21, and slits 45A and 45B are formed so that the second clamping parts 44A and 44B can move parallel to each other. Furthermore, it is designed so that the second clamping parts 44A and 44B lock (or clamp) the clamped portion 21b in place by means of preliminary-pressure adjustment screws 58A and 58B when the clamping piezo-electric actuator 57 is in a power-"off" state.

The operation of the above embodiment will now be described. As described above, when the first and second clamping piezo-electric actuators 54 and 57 are in a power-"off" state, the first and second clamped portions 21a and 21b of the slide block 21 are respectively clamped by the first clamping parts 37A and 37B and second clamping parts 44A and 44B. Accordingly, even if there should be a power failure, the slide block 21 is automatically held in position where the slide block 21 is located at the time of such a power failure.

Figure 5:
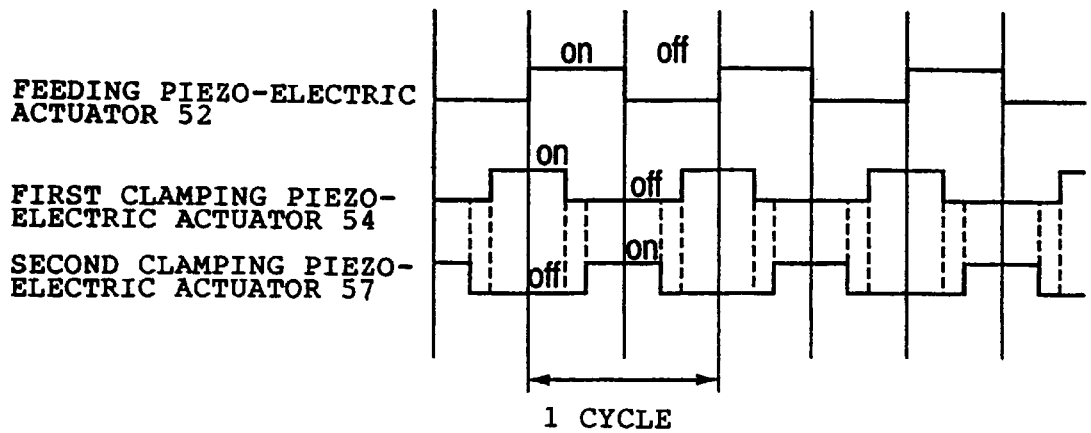
FIG. 5 is a diagram which illustrates the operation of the piezo-electric actuators during wire cutting.

First, the operation during wire cutting will be described mainly with reference to FIG. 5.

When power to the first clamping piezo-electric actuator 54 is switched "on" with the second clamping piezo-electric actuator 57 in a power-"off" state, the second clamping parts 44A and 44B of the second clamping body 40 are in a state wherein they clamp the clamped portion 21b of the slide block 21, while the first clamping parts 37A and 37B of the first clamping body 30 are in a state wherein they do not clamp the clamped portion 21a of the slide block 21.

When the power to the feeding piezo-electric actuator 52 is switched "on" in this state, the feeding piezo-electric actuator 52 extends in the direction indicated by arrow B (see FIG. 1), thus causing the thin-wall sections 33A and 33B to undergo elastic deformation (or expansion), and the arm sections 32A and 32B are shifted by a prescribed amount (e. g., 15 microns/150 V) in the same direction (i. e., in the direction indicated by arrow B).

When the power to the clamping piezo-electric actuator 54 is switched "off" in the above-described state in which the arm sections 32A and 32B are shifted, the first clamping parts 37A and 37B clamp the clamped portion 21a of the slide block 21.

Next, when the power to the clamping piezo-electric actuator 57 is switched "on" and the power to the feeding piezo-electric actuator 52 is switched "off", the second clamping parts 44A and 44B release the clamped portion 21b of the slide block 21, and the feeding piezo-electric actuator 52 contracts in the direction indicated by arrow A, thus causing the thin-wall sections 33A and 33B to undergo elastic recovery so that the arm sections 32A and 32B move by a prescribed amount (15 microns) in the same direction (i. e., the direction indicated by arrow A).

The above series of operations constitute one cycle. In this cycle of movement, the slide block 21 is moved by a prescribed amount (15 microns) in the direction for wire cutting, i. e., in the direction indicated by arrow A. Since the amount of movement of the slide block 21 required for wire cutting is 100 microns, and since the amount of movement accomplished in one cycle in the embodiment described above is 15 microns, six 15-micron feeding cycles are performed (for a total movement of 90 microns).

Meanwhile, since the amount of contraction of the feeding piezo-electric actuator 52 is proportional to the voltage, the remaining distance of 10 microns is covered by driving the actuator 52 at the rate of 10 microns/100 V (in the case of the abovementioned rate of 15 microns/150 V). In this case, when assuming that the driving cycle is 1 kHz, the wire feeding speed is 15 mm/s, and the wire feeding time required for a movement of 100 microns in the case of wire cutting is approximately 7 ms.

Figure 6:
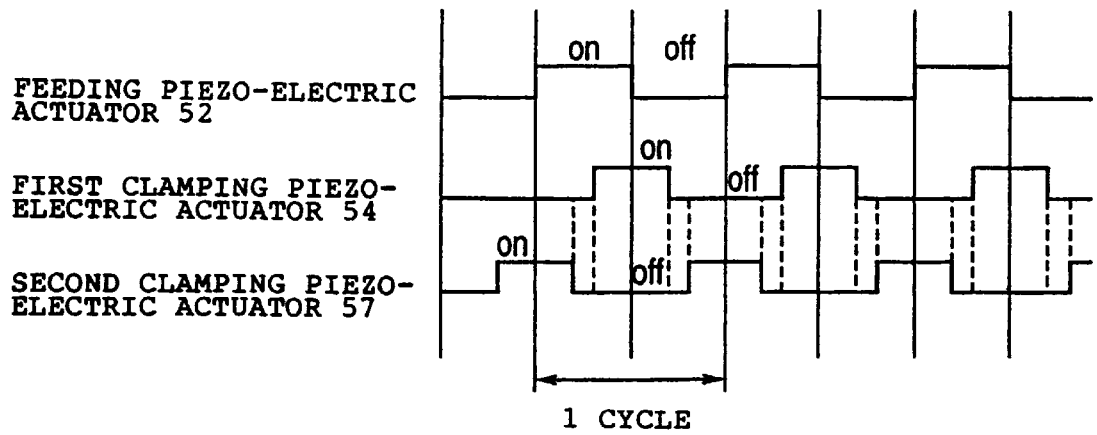
FIG. 6 is a diagram which illustrates the operation of the piezo-electric actuators during wire feeding.

Next, the operation during wire feeding will be described with reference to FIG. 6. In this case, the operations of the clamping piezo-electric actuators 54 and 57 are the reverse of the operations during wire cutting.

More specifically, the power to the clamping piezo-electric actuator 57 is switched "on", and the clamping piezo-electric actuator 54 is put in a power-"off" state. In this situation, the first clamping parts 37A and 37B of the first clamping body 30 are in a state wherein they clamp the clamped portion 21a of the slide block 21, and the second clamping parts 44A and 44B of the second clamping body 40 are in a state wherein they do not clamp the clamped portion 21b of the slide block 21. When the power to the feeding piezo-electric actuator 52 is switched "on" in this state, the feeding piezo-electric actuator 52 extends in the direction indicated by arrow B, thus causing the thin-wall sections 33A and 33B to undergo elastic deformation (or expansion), so that the arm sections 32A and 32B are shifted by a prescribed amount (e. g., 15 microns/150 V) in the same direction (i. e., in the direction indicated by arrow B). In other words, since the first clamping parts 37A and 37B are clamping the slide block 21 at this time, the slide block 21 also moves in the same direction (i. e., the direction indicated by arrow B).

When the power to the clamping piezo-electric actuator 57 is switched "off" in the above-described state in which the arm sections 32A and 32B are shifted and the slide block 21 has moved, the second clamping parts 44A and 44B clamp the clamped portion 21b of the slide block 21. When the power to the clamping piezo-electric actuator 54 is switched "on" and the power to the feeding piezo-electric actuator 52 is switched "off", the first clamping parts 37A and 37B release the clamped portion 21a of the slide block 21, and the feeding piezo-electric actuator 52 contracts in the direction indicated by arrow A, thus causing the thin-wall sections 33A and 33B to undergo elastic recovery so that the arm sections 32A and 32B move by a prescribed amount (15 microns) in the same direction (i. e., the direction indicated by arrow A).

The above series of operations constitutes one cycle. In this cycle of movement, the slide block 21 is moved by a prescribed amount (15 microns) in the direction for wire feeding (i. e., in the direction indicated by arrow B). Since the amount of movement of the slide block 21 required for wire feeding is 400 microns and since the amount of movement accomplished in one cycle in the embodiment described above is 15 microns, twenty-six 15-micron feeding cycles are performed for a total movement of 390 microns. The remaining distance of 10 microns is covered by driving at the rate of 10 microns/100 V. In this case, when the driving cycle is 1 kHz, then the wire feeding speed is 15 mm/s, and the wire feeding time required for a movement of 400 microns in the case of wire feeding is approximately 27 ms.

Second Embodiment

Figure 7:
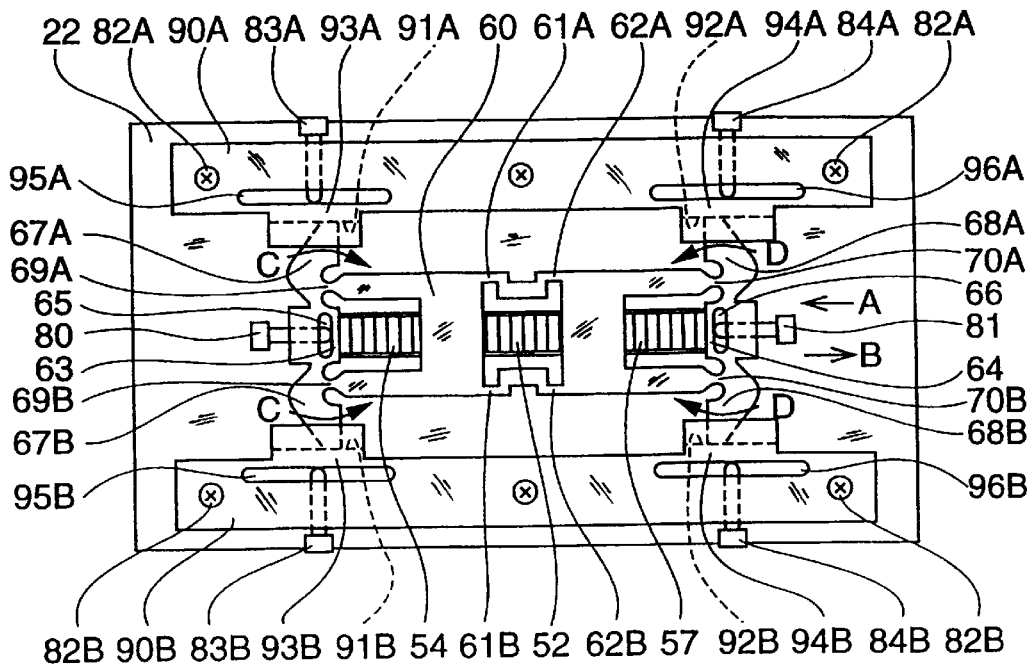
FIG. 7 is a front view which illustrates a second embodiment of the wire cutting and feeding device for use in a wire bonding apparatus provided by the present invention.
Figure 8:
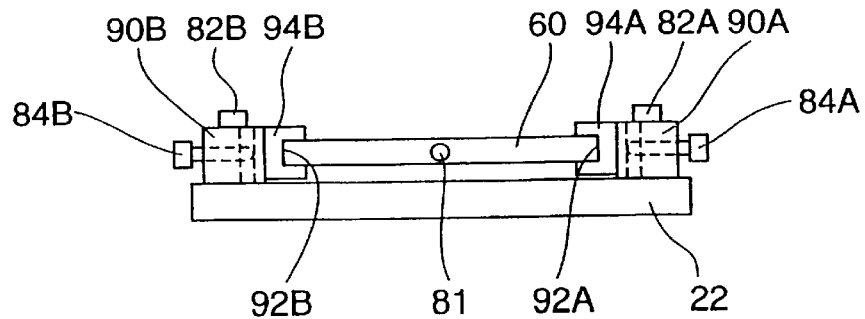
FIG. 8 is a right-side view of FIG. 7.

FIGS. 7 and 8 illustrate a second embodiment of the present invention.

Both ends of a feeding piezo-electric actuator 52 which is disposed in the direction of wire cutting and wire feeding (i. e., in the direction indicated by arrows A and B) are fastened to the central portion of a moving plate 60 to which the attachment plate 5 shown in FIG. 1 is fastened, and both ends of clamping piezo-electric actuators 54 and 57 which are likewise disposed in the direction of wire cutting and wire feeding (i. e., the direction indicated by arrows A and B) are fastened to the left and right end portions of the moving plate 60. First thin-wall portions 61A and 61B and second thin-wall portions 62A and 62B are formed in the fastening areas of the moving plate 60 to which the feeding piezo-electric actuator 52 is fastened, so that the expanding and contracting action of the feeding piezo-electric actuator 52 causes the fastening area to make a parallel movement in the direction indicated by the arrows A and B.

Furthermore, slits 65 and 66 are formed in the outer areas of the moving plate 60 to which the clamping piezo-electric actuators 54 and 57 are fastened, so that diaphragm parts 63 and 64 which are capable of parallel movement are formed. Preliminary-pressure adjustment screws 80 and 81 which press the diaphragm parts 63 and 64 against the clamping piezo-electric actuators 54 and 57 are screwed into the moving plate 60. First clamped portions 67A and 67B and second clamped portions 68A and 68B (which are clamped by clamping parts as described below and therefore referred to as "clamped portions 67A, 67B, 68A and 68B") are disposed on both sides of the moving plate 60 so as to be located at both the left and right ends of the moving plate 60. Furthermore, first thin-wall sections 69A and 69B and second thin-wall sections 70A and 70B are formed so that the first clamped portions 67A and 67B and the second clamped portions 68A and 68B can pivot in the direction indicated by arrow C and the direction indicated by arrow D, respectively, by the expansion and contraction of the clamping piezo-electric actuators 54 and 57.

Guide blocks 90A and 90B which are disposed facing each other in order to guide and clamp the moving plate 60 are provided on a base plate 22, which is fastened to the Z direction driver 1 shown in FIG. 1, by bolts 82A and 82B. First clamping parts 93A and 93B and second clamping parts 94A and 94B, in which first guide grooves 91A and 91B and second guide groove 92A and 92B that guide the first clamped portions 67A and 67B and the second clamped portions 68A and 68B are formed, are disposed on the mutually facing surfaces of the guide blocks 90A and 90B. First slits 95A and 95B and second slits 96A and 96B are formed in the guide blocks 90A and 90B so as to allow the first and second clamping parts 93A and 93B and 94A and 94B to make parallel movements. Furthermore, first adjustment screws 83A and 83B and second adjustment screws 84A and 84B are provided. These screws are adjusted so that the first clamping parts 93A and 93B and second clamping parts 94A and 94B lock (lock) the first and second clamped portions 67A and 67B and 68A and 68B of the moving plate 60, respectively, when the clamping piezo-electric actuators 54 and 57 are in a power-"off" state.

The operation of the second embodiment will now be described.

As in the first embodiment, the first and second clamped portions 67A and 67B and 68A and 68B of the moving plate 60 are respectively clamped by the first and second clamping parts 93A and 93B and 94A and 94B of the guide blocks 90A and 90B when the clamping piezo-electric actuators 54 and 57 are in a power-"off" state. Accordingly, even if there should be a power failure, the moving plate 60 is held in the position where the moving plate is located at the time of such a power failure.

First, the operation during wire cutting will be described.

When power to the clamping piezo-electric actuator 54 is switched "on" with the clamping piezo-electric actuator 57 in a power-"off" state, the second clamped portions 68A and 68B of the moving plate 60 are in a state in which the clamped portions are clamped by the second clamping parts 94A and 94B of the guide blocks 90A and 90B; while the first clamped portions 67A and 67B of the moving plate 60 pivot via the first thin-wall sections 69A and 69B in the direction indicated by arrow C as a result of the extension of the clamping piezo-electric actuator 54, so that the first clamped portions 67A and 67B are released by the first clamping parts 93A and 93B of the guide blocks 90A and 90B. When the power to the feeding piezo-electric actuator 52 is switched "on" in this state, the first thin-wall sections 61A and 61B and the second thin-wall sections 62A and 62B of the moving plate 60 are caused to extend in the direction indicated by arrow B (undergoing elastic deformation), so that the left end of the moving plate 60 is caused to extend by a prescribed amount (e. g., 15 microns/150 V) in the same direction (i. e., the direction indicated by arrow B).

Conversely, when the power to the clamping piezo-electric actuator 54 is switched "off" with the left end of the moving plate 60 in such an extended state, the first clamped portions 67A and 67B pivot in the opposite direction from the direction indicated by arrow C, and are clamped by the first clamping parts 93A and 93B. Next, when the power to the clamping piezo-electric actuator 57 is switched "on", the second clamped portions 68A and 68B of the moving plate 60 pivot via the second thin-wall sections 70A and 70B in the direction indicated by arrow D as a result of the extension of the clamping piezo-electric actuator 57, so that the second clamped portions 68A and 68B are released by the second clamping parts 94A and 94B of the guide blocks 90A and 90B. Then, when the power to the feeding piezo-electric actuator 52 is switched "off", the feeding piezo-electric actuator 52 contracts in the direction indicated by arrow A, thus causing the first and second thin-wall sections 61A and 61B and 62A and 62B to undergo elastic recovery so that the right end of the moving plate 60 moves by a prescribed amount (15 microns) in the same direction (i. e., in the direction indicated by arrow A).

The above series of operations constitutes one cycle. In this cycle of movement, the moving plate 60 moves by a prescribed amount (15 microns) in the direction of movement required for wire cutting (i. e., in the direction indicated by arrow A). Since the amount of movement of the moving plate 60 required for wire cutting is 100 microns, and since the amount of movement accomplished in one cycle in this embodiment is 15 microns, six 15-micron feeding cycles are performed (for a total movement of 90 microns). The remaining distance of 10 microns is covered by driving at the rate of 10 microns/100 V. In this case, when the driving cycle is 1 kHz, then the wire feeding speed is 15 mm/s, and the wire feeding time required for a movement of 100 microns in the case of wire cutting is approximately 7 ms.

Next, the operation during wire feeding of the second embodiment will be described.

In this case, the operations of the clamping piezo-electric actuators 54 and 57 are the reverse of the operations during wire cutting. More specifically, when the power to the clamping piezo-electric actuator 57 is switched "on" with the clamping piezo-electric actuator 54 in a power-"off" state, the first clamped portions 67A and 67B of the moving plate 60 are clamped by the first clamping parts 93A and 93B of the guide blocks 90A and 90B. Meanwhile, the second clamped portions 68A and 68B of the moving plate 60 pivot via the second thin-wall sections 70A and 70B in the direction indicated by arrow D as a result of the extension of the clamping piezo-electric actuator 57, so that the clamped portions are released by the second clamping parts 94A and 94B of the guide blocks 90A and 90B. When the power to the feeding piezo-electric actuator 52 is switched "on" in this state, the first thin-wall sections 61A and 61B and the second thin-wall sections 62A and 62B of the moving plate 60 are caused to extend in the direction indicated by arrow B (undergoing elastic deformation), so that the right end of the moving plate 60 is caused to extend by a prescribed amount (e. g., 15 microns/150 V) in the same direction (i. e., the direction indicated by arrow B).

Conversely, when the power to the clamping piezo-electric actuator 57 is switched "off" with the right end of the moving plate 60 in such an extended state, the second clamped portions 68A and 68B pivot in the opposite direction from the direction indicated by arrow D and are clamped by the second clamping parts 94A and 94B. Next, when the power to the clamping piezo-electric actuator 54 is switched "on", the first clamped portions 67A and 67B of the moving plate 60 pivot via the first thin-wall sections 69A and 69B in the direction indicated by arrow C as a result of the extension of the clamping piezo-electric actuator 54, so that the first clamped portions 67A and 67B are released by the first clamping parts 93A and 93B of the guide blocks 90A and 90B. Then, when the power to the feeding piezo-electric actuator 52 is switched "off", the feeding piezo-electric actuator 52 contracts in the direction indicated by arrow B, thus causing the first and second thin-wall sections 61A and 61B and 62A and 62B to undergo elastic recovery so that the left end of the moving plate 60 moves by a prescribed amount (15 microns) in the same direction (i. e., in the direction indicated by arrow B).

The above series of operations constitutes one cycle. In this cycle of movement, the moving plate 60 moves by a prescribed amount (15 microns) in the direction of movement required for wire feeding (i. e., in the direction indicated by arrow B). Since the amount of movement of the moving plate 60 required for wire feeding is 400 microns, and since the amount of movement accomplished in one cycle in the present embodiment is 15 microns, twenty-six 15-micron feeding cycles are performed (for a total movement of 390 microns). The remaining distance of 10 microns is covered by driving at the rate of 10 microns/100 V. In this case, when the driving cycle is 1 kHz, then the wire feeding speed is 15 mm/s, and the wire feeding time required for a movement of 400 microns in the case of wire feeding is approximately 27 ms.

Third Embodiment

Figure 9:
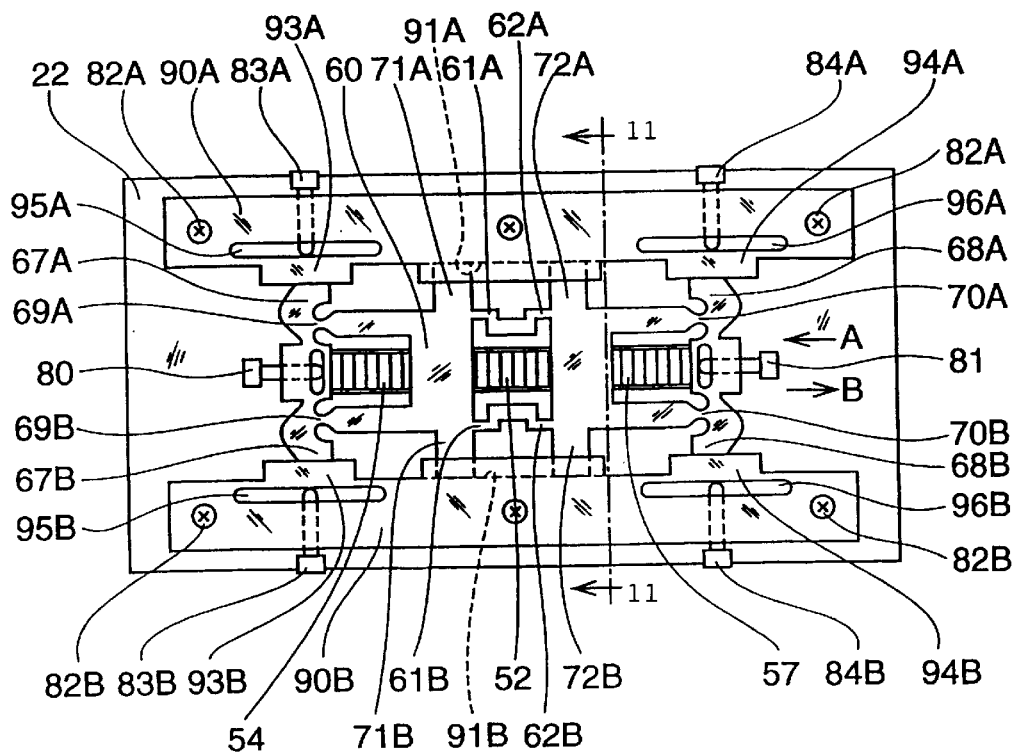
FIG. 9 is a front view which illustrates a third embodiment of the wire cutting and feeding device for use in a wire bonding apparatus provided by the present invention.
Figure 10:
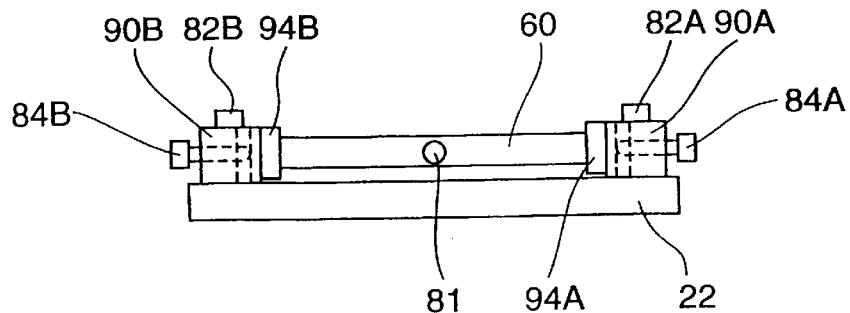
FIG. 10 is a right-side view of FIG. 9.
Figure 11:
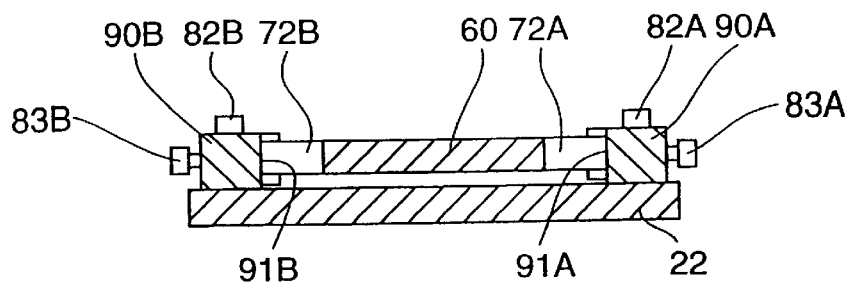
FIG. 11 is a sectional view along line 11—11 in FIG. 9.
Figure 12:
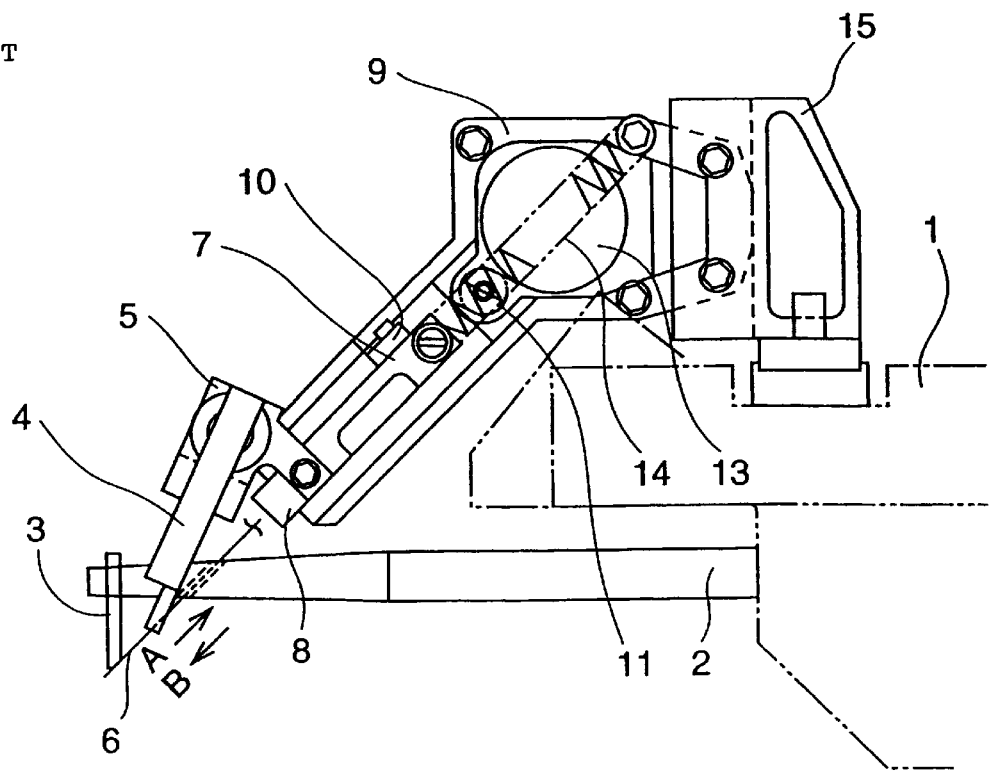
FIG. 12 is a front view which illustrates a conventional wire cutting and feeding device for use in a wire bonding apparatus.
Figure 13:
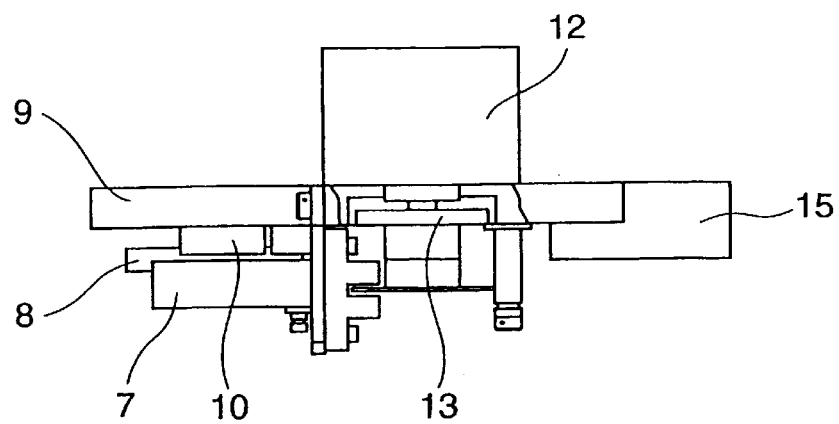
FIG. 13 is a plan view of essential areas in FIG. 12.

FIGS. 9 through 11 illustrate a third embodiment of the present invention. This embodiment is a modification of the second embodiment.

No first guide grooves 91A and 91B and second guide grooves 92A and 92B are formed in the first clamping parts 93A and 93B and in the second clamping parts 94A and 94B of the guide blocks 90A and 90B of this third embodiment. Instead, the first clamping parts 93A and 93B and the second clamping parts 94A and 94B are provided so as to clamp only the first and second clamped portions 67A and 67B and 68A and 68B, respectively, of the moving plate 60. Furthermore, guide grooves 91A and 91B are formed in the guide blocks 90A and 90B, respectively; and first sliding sections 71A and 71B and second sliding sections 72A and 72B which are guided by these guide grooves 91A and 91B are formed in the moving plate 60.

This third embodiment can operate in substantially the same manner as the second embodiment.

First, Second and Third Embodiments

In the respective embodiments described above, the operations during wire cutting and wire feeding are performed with a rough feeding precision (e. g., with a feeding precision of 15 microns). However, it is possible to perform the operations using a combination of rough feeding precision and fine feeding precision.

For example, in a case where the amount of movement required for wire cutting is 100 microns, the first 90 microns of this amount of movement is performed by a rough movement, while the remaining 10 microns of the amount of movement is performed by a fine movement. Furthermore, in a case where the amount of movement required for wire feeding is 400 microns, the first 375 microns of this amount of movement is performed by a rough movement, while the remaining 25 microns of the amount of movement is performed by a fine movement. In the rough movement, the feeding piezo-electric actuator 52 is driven at, for example, at the rate of:

{15 microns/150 V}×1 kHz and in the fine movement, the feeding piezo-electric actuator 52 is driven (for example) at the rate of {5 microns/50 V}×1 kHz In other words, the feeding speed and feeding precision can be specified as desired by using selected combinations of driving voltage and driving frequency in the feeding piezo-electric actuator 52 in accordance with selected combinations of rough and precise movements, so that the feeding precision can be improved.

As seen from the above, according to the present invention, piezo-electric actuators are used as a driving source so as to move the wire clamper. Accordingly, the size and weight of the apparatus can be small. Furthermore, since there is no need to use a coil spring as in conventional devices, the mechanical rigidity of the device is high, and almost no vibration occurs. Moreover, the precision of wire cutting and wire feeding can be simply improved, and combinations of rough movement and fine movement can be performed by altering the driving voltage of the piezo-electric actuator. In addition, the speed of wire cutting and wire feeding can easily be altered by altering the driving voltage and driving frequency of the piezo-electric actuator.

We claim:

1. A wire cutting and feeding device for use in a wire bonding apparatus comprising:
    a wire clamper for clamping a wire after said wire has been bonded to a second bonding point,
    a moving member for moving said wire clamper to pull upward in a wire cutting directon so as to cut said wire, said moving member then moving downward in a wire feeding direction so that a tail length portion required for a next bonding operation to a next first bonding point is caused to extend from a lower end of said bonding tool, and
    piezo-electic actuators for driving said moving member.

2. A wire cutting and feeding device according to claim 1, wherein said piezo-electrics include:
    a feeding piezo-electric actuator which is used to cause expansion and contraction of said moving member, and
    two clamping piezo-electric actuators which are used alternately so as to clamp said moving member,
    causing said moving member to move by means of respective power "on" and power "off" combinations of said feeding piezo-electric actuator and said clamping piezo-electric actuators.

3. A wire cutting and feeding device for use in a wire bonding apparatus comprising:
    a wire clamper for clamping a wire after said wire has been bonded to a second bonding point,
    a moving member for moving said wire clamper to pull upward in a wire cutting direction so as to cut said wire, said moving member then moving downward in a wire feeding direction so that a tail length portion required for a next bonding operation to a next first bonding point is caused to extend from a lower end of said bonding tool, said device further including:
    a slide block which has two clamped portions comprising first and second clamped portions and moves said wire clamper, and a first clamping body and a second clamping body which are fastened to a base plate, and
    said first clamping body, which is expandable and contractible, comprising:
        a fastening section fastened to a base plate,
        arm sections which have clamping parts that clamp said first clamped portion, and
        elastically deformable thin wall sections which connect said fastening sections and said arm sections,
    second clamping body comprising:
        a fastening section fastened to said base plate, and
        arm sections which have clamping parts that clamp said second clamped porton, and
    said device still futher including:
        a feeding piezo-electic actuator which is attached to said first clamping body and moves said arm sections of said first clamping body by causing elastic deformation of said thin-wall sections of said first clamping body,
        a first clamping piezo-electric actuator which is attached to said arm sections of said first clamping body and opens and closes said clamping parts of said arm sections, and
        a second clamping piezo-electc actuator which is attached to said arm sections of said second clamping body and opens and closes said clamping parts of said arm sections.

4. A wire cutting and feeding device for use in a wire bonding apparatus comprising:
    a wire clamper for clamping a wire after said wire has been bonded to a second bonding point,
    a moving member for moving said wire clamper to pull upward in a wire cutting direction so as to cut said wire, said moving member then moving downward in a wire feeding direction so that a tail length portion required for a next bonding operation to a next first bonding point is caused to extend from a lower end of said bonding tool, wherein said device further comprises:
    a moving plate which has first and second clamped portions and moves said wire clamper,
    guide blocks which are fastened to a base plate and have first and second clamping parts that clamp said first and second clamped portions of said moving plate,
    a feeding piezo-electric actuator which is fastened to said central portion of said moving plate, and
    two clamping piezo-electric actuators comprising first and second clamping piezo-electric actuators which are fastened to both end portions of said moving plate with respect to said direction of movement, and wherein
    said moving plate is caused to move in said wire cutting and wire feeding directions by expansion and contraction of said feeding piezo-electric actuator, and
    said first and second clamping parts of said guide blocks are caused to clamp said first and second clamped portions, respectively, of said moving plate by said expansion and contraction of said first and second clamping piezo-electric actuators.

* * * * *